United States Patent [19]

Leung

[11] Patent Number: 5,406,283
[45] Date of Patent: Apr. 11, 1995

[54] MULTI-BIT OVERSAMPLED DAC WITH DYNAMIC ELEMENT MATCHING

[75] Inventor: Bosco Leung, Waterloo, Canada

[73] Assignee: University of Waterloo, Waterloo, Canada

[21] Appl. No.: 55,713

[22] Filed: Apr. 29, 1993

[30] Foreign Application Priority Data

May 1, 1992 [GB] United Kingdom ............ 9209498

[51] Int. Cl.⁶ ........................................ H03M 3/02
[52] U.S. Cl. .................................. 341/143; 341/150
[58] Field of Search ................... 341/118, 143, 150

[56] References Cited

U.S. PATENT DOCUMENTS

| | | | |
|---|---|---|---|
| 4,404,544 | 9/1983 | Dwarakanath | 341/150 |
| 4,988,900 | 1/1991 | Fensch | 307/494 |
| 5,072,219 | 12/1991 | Boutaud et al. | 341/150 |
| 5,225,835 | 7/1993 | Majima et al. | 341/143 |
| 5,252,973 | 10/1993 | Masuda | 341/131 |

OTHER PUBLICATIONS

L. Richard Carley, "A Noise-Shaping Coder Topology For 15+ Bit Converters," IEEE Journal of Solid-State Circuits, Vol. 24, No. 2, pp. 267–273 (April, 1989).
L. Richard Carley, "An Oversampling Analog-to-Digital Converter Topology for High Resolution Signal Acquisition Systems," IEEE Transactions on Circuits and Systems, Vol. CAS-34, No. 1, pp. 83–90 (January, 1987).

(List continued on next page.)

Primary Examiner—Marc S. Hoff
Attorney, Agent, or Firm—Knobbe, Martens, Olson & Bear

[57] ABSTRACT

A Sigma-Delta converter, has a receiver for receiving an input digital signal; a digital loop filter and quantizer having an input and an output; a summer having a first input connected to the receiver, a second input connected to the output of the digital loop filter and quantizer, and an output connected to the input of the digital loop filter and quantizer for subtracting from the input digital signal an output digital signal from the digital loop filter and quantizer, and in response generating a difference signal for application to the input of the digital loop filter and quantizer; and a digital-to-analog converter having a plurality of unit elements with minor mismatching therebetween, for receiving and converting to analog the output digital signal from the digital loop filter and quantizer, and in response generating an output analog signal, wherein the digital-to-analog converter has a selector for cyclically selecting successive different permutations of the unit elements for converting each value of the output digital signal thereby cancelling the mismatching between unit elements.

4 Claims, 9 Drawing Sheets

OTHER PUBLICATIONS

R.H. Walden, T. Cataltepe, G.C. Temes, "Architectures for High-Order Multibit Σ-Δ Modulators," Proceeding of the 1990 IEEE International Symposium On Circuits and Systems, pp. 895–898 (May, 1990).

T. Cataltepe, A.R. Kramer, L.E. Larson, G.C. Temes, R.H. Walden, "Digitally Corrected Multi-Bit Σ-Δ Data Converters," Proceedings of the 1989 IEEE International Symposium On Circuits and Systems, pp. 647–650 (May, 1989)

J. Fattaruso, Sami Kiriaki, Greg Warwar, Michiel de Wit, "Self-Calibration Techniques for a Second-Order Multi-bit Sigma-Delta Modulator," Digest of the 1993 IEEE International Solid-State Circuite Conference, pp. 228–229 (February, 1993).

Yasuaki Sakina, "Multi-Bit Σ$^\Delta$ Analog-to-Digital Converters with Nonlinearity Correction Using Dynamic Barrel Shifting," Master Thesis, pp. 1–76 (May, 1990).

B. Leung, "Architectures for Multi-Bit Oversampled A/D Employing Dynamic Element Matching Techniques," 1991 IEEE International Symposium on Circuits and Systems, pp. 1657–1660 (May 1991).

F. Chen, B. Leung, "A Multi-Bit Σ-Δ DAC with Dynamic Element Matching Techniques," Proceedings of IEEE Custom Integrated Circuit Conference, pp. 16.2.1–16.2.4 (May, 1992).

B. Leung, "Pipelined Multi-bit Oversampled Digital to Analog Converters with Capacitor Averaging, Analog Integrated Circuits and Signal Processing, An International Journal, pp. 139–156 (Vol. 2, no. 2, April, 1992).

B. Song, M. Tompsett, K. Lakshmikumarl, "A 12-bit 1–Msample/s Capacitor Error-Averaging Pipelined A/D Converter," IEEE Journal of Solid-State Circuits, Vol. 23, No. 6, pp. 1324–1333 (December, 1988).

F. Wang, G. Temes, S. Law, "A Quasi-Passive CMOS Pipelines D/A Converter," IEEE Jornal of Solid-State Circuits, Vol. 24, No. 6, pp. 1752–1755. (December, 1989).

Y. Lin, B. Kim, P. Gray, "A 13-b 2.5-MHz Self-Calibrated Pipelined A/D Converter in 3-$\mu$m CMOS," IEEE Journal of Solid-State Circuits, Vol: 26, No. 4, pp. 628–636 (April 1991).

K. Bult, G. Geelen, "A Fast-Settling CMOS Op AMP with 90dB DC Gain and 116MHz Unity-Gain Frequency," Digest of Technical Papers, IEEE International Solid-State Circuits Conference 1990, pp. 108–109 (February, 1990).

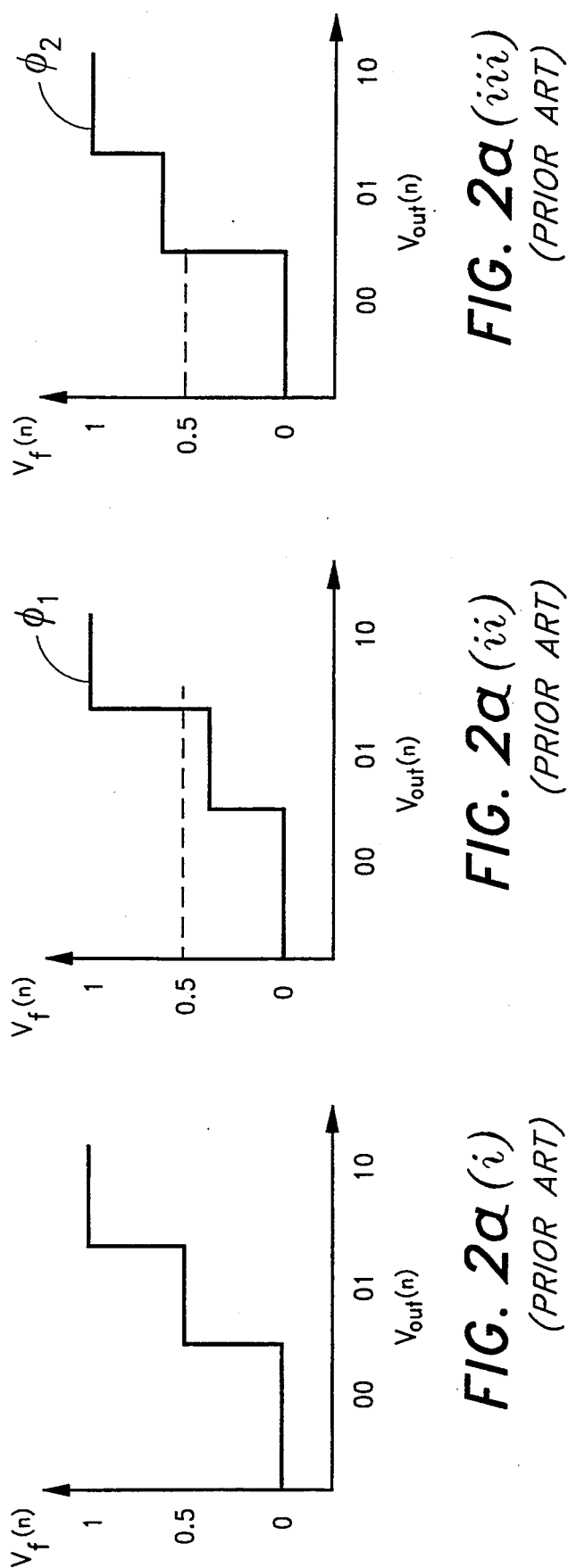

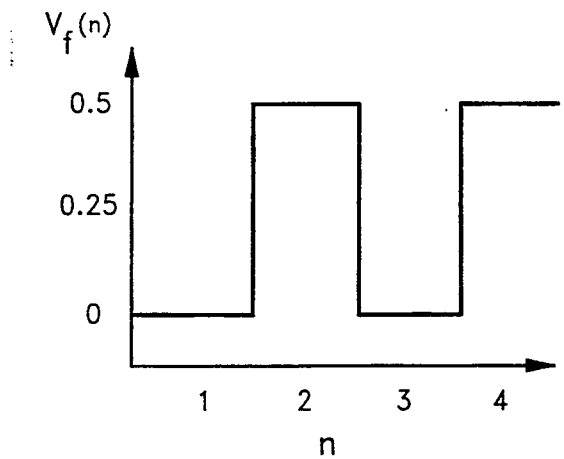
FIG. 2b(i)
(PRIOR ART)
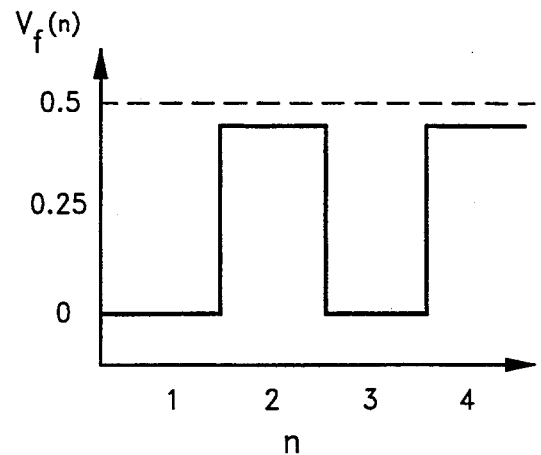
FIG. 2b(ii)
(PRIOR ART)
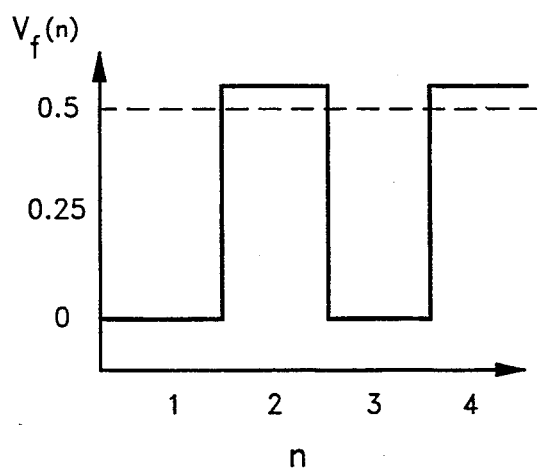
FIG. 2b(iii)
(PRIOR ART)
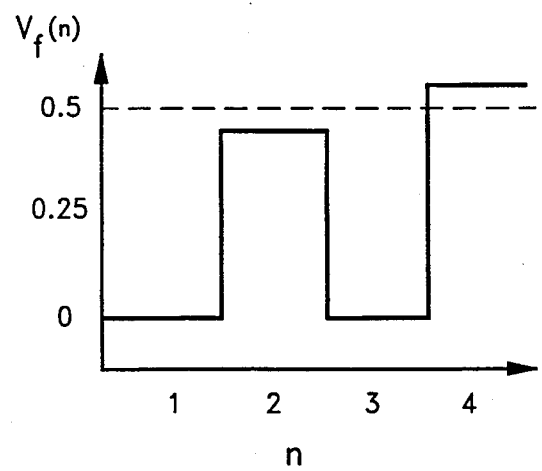
FIG. 2b(iv)

MULTI-BIT OVERSAMPLED DAC WITH DYNAMIC ELEMENT MATCHING

FIELD OF THE INVENTION

The present invention relates in general to oversampling converters, and more particularly to a multi-bit (D/A) digital-to-analogue converter with dynamic element matching.

BACKGROUND OF THE INVENTION

Oversampling methods are known in the art of A/D and D/A conversion for overcoming problems associated with the use of analogue low-pass filters in conventional pulse code modulation. More particularly, in conventional systems, low-pass filters must be used to limit aliasing noise in A/D conversion and to smooth the output analogue signal in D/A conversion. However, VLSI does not lend itself well to the fabrication of high-precision analogue circuits.

Recent advances in oversampling techniques are discussed in a paper entitled Oversampling Methods for A/D and D/A Conversion by James C. Candy and Gabor C. Temes. Candy and Temes discuss a number of embodiments of Sigma-Delta modulators for oversampling conversion. One problem discussed by Candy and Temes is the provision of a feedback D/A converter in multi-bit Sigma-Delta converters. Specifically, the conversion error in the feedback D/A converter must be very small (i.e. less than half the least significant bit of the final output digital word). This is because any D/A conversion error which is added to the D/A output signal is directly subtracted from the input signal to the Sigma-Delta converter so as to appear in the digital output of the converter. Candy and Temes discuss a number of strategies for overcoming the problem of D/A error in Delta-Sigma modulators, such as trimming of D/A converter elements, randomization of errors introduced by mismatching of components, and digital correction of the D/A conversion error.

However, the prior art approach of trimming components has been found to be extremely expensive, and the use of digital error correction results in a requirement for extra correction hardware, as described in R. H. Walden, Catultepe, G. C. Temes, "Architectures for high-order multibit Σ-Δ modulators," Proceedings of the 1990 IEEE International Symposium On Circuits and Systems, pp. 895–898 (May, 1990). The use of random averaging is known to result in a reduced signal-to-noise ratio (SNR) because all the harmonic distortions have been translated into white noise that falls partly inside the passband, as described in R. Carley, "A Noise-Shaping Coder Topology for 15+ Bit Converters," IEEE Journal of Solid-State Circuits, pp. 267–273 (April, 1989). Straightforward application of clocked averaging results in tones falling inside the passband, as well as an increase in passband noise, as discussed in greater detail below and as discussed in Yashui Sakina, P. Gray, "Multi-bit Σ-Δ analog to digital converters with nonlinearity correction using dynamic barrel shifting," Master Thesis, pp. 24–32 (June 1990) & B. Leung, "Architectures for Multi-bit Oversampling A/D Converter Employing Dynamic Element Matching Techniques," 1991 IEEE International Symposium on Circuits and Systems, pp. 1657–1660 (May, 1991).

SUMMARY OF THE INVENTION

According to the present invention, a novel class of dynamic element matching techniques is applied to multi-bit Sigma-Delta converters for translating the harmonic distortion components of the non-ideal feedback D/A converter to high frequency components which can then be filtered out by use of a decimation filter.

More particularly, a novel feedback D/A converter is provided for use within a Sigma-Delta A/D converter in which individual level averaging is provided for converting distortion components caused by element mismatch in the feedback D/A converter to high frequency noise lying outside of the passband. This noise, which is due to element mismatch, has a similar frequency behaviour as quantization noise. Consequently, the accuracy requirements on the feedback D/A converter of the present invention are reduced without increasing the baseband noise appreciably.

According to a second dynamic element matching technique of the present invention, pipelining and periodic capacitor averaging techniques are used for translating the harmonic distortion components of the non-ideal D/A converter in an oversampled Sigma-Delta D/A converter to frequency components in the vicinity of $f_s/2$, where $f_s$ is the sampling frequency. These frequency components can then be filtered out utilizing an analog lowpass anti-imaging filter. Compared to conventional clocked averaging schemes as discussed below, the tones generated utilizing pipelining with capacitor averaging are significantly further from the passband.

BRIEF INTRODUCTION TO THE DRAWINGS

A detailed description of prior art conventional clocked averaging systems and the system of the present invention are provided herein below with reference to the following drawings, in which:

FIG. 2a shows for the A/D converter of FIG. 1, the transfer characteristics of a two bit, three level ideal feedback D/A converter (i), and the transfer characteristics where there is a mismatch between unit elements in the feedback D/A converter (ii) and (iii);

FIG. 2b shows the output $V_f(n)$ of the feedback D/A converter of FIG. 1 with $V_{in}(n)$ equal 0.25 for (i) an ideal D/A converter, (ii) a non-ideal D/A converter, (iii) a D/A converter with clocked averaging, and (iv) a D/A converter with individual averaging;

Figure 3:
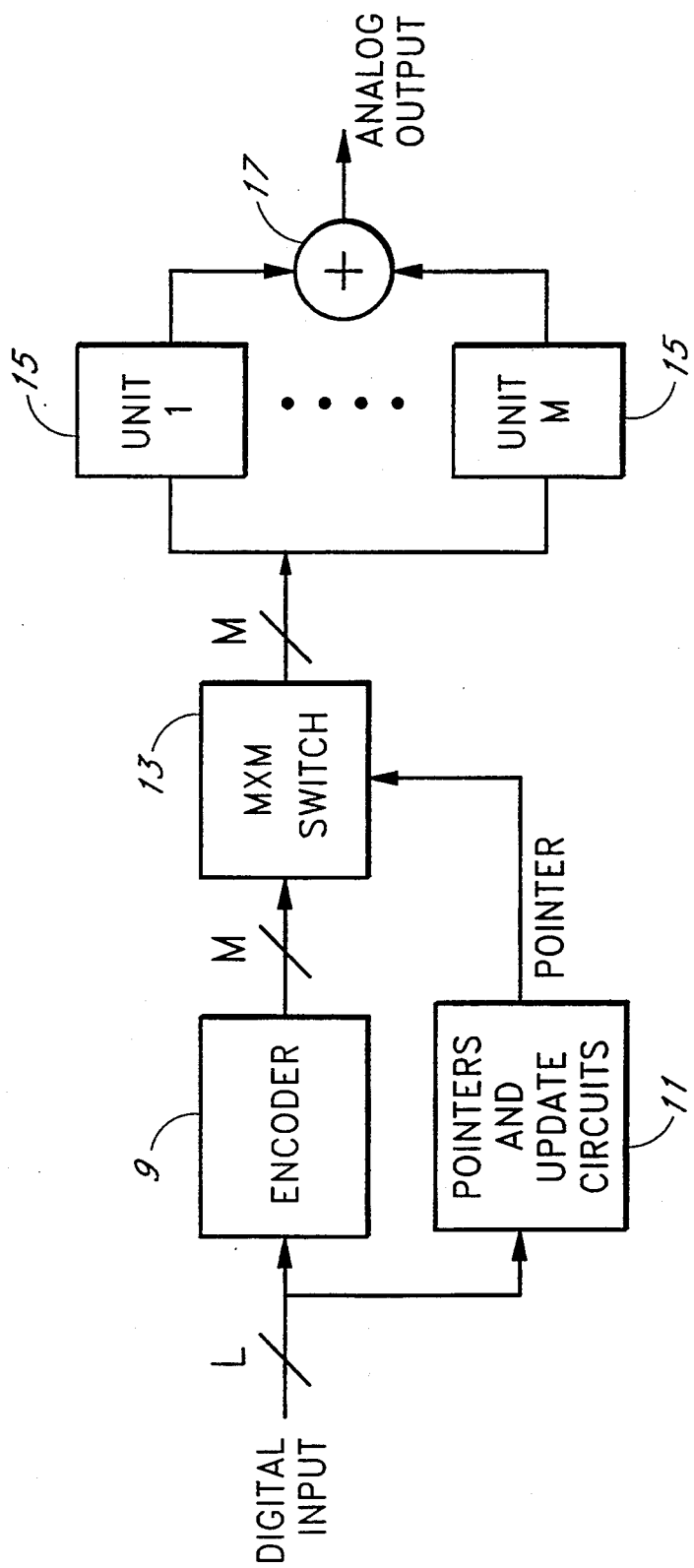
FIG. 3 is a block diagram of an internal D/A converter incorporating individual level averaging.
Figure 5:
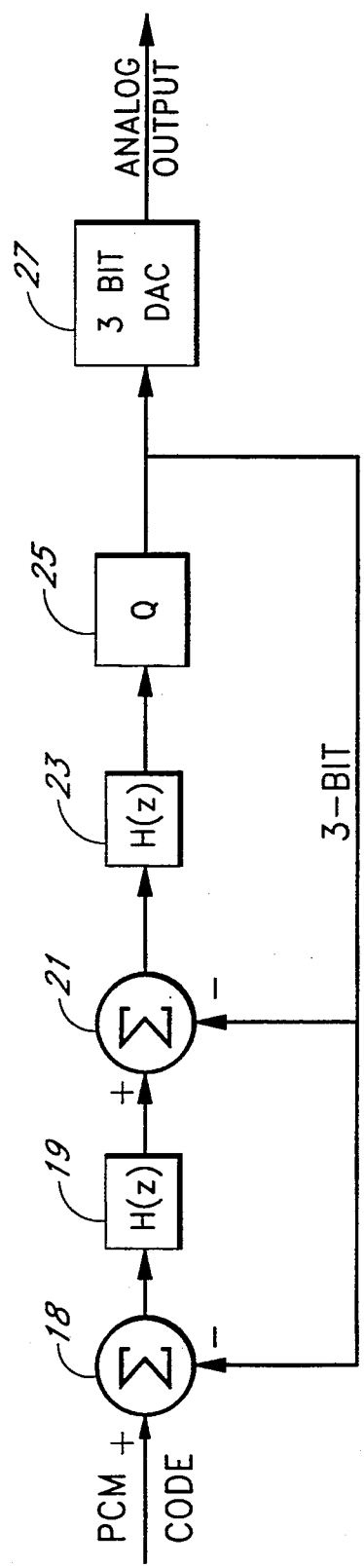
Figure 6:
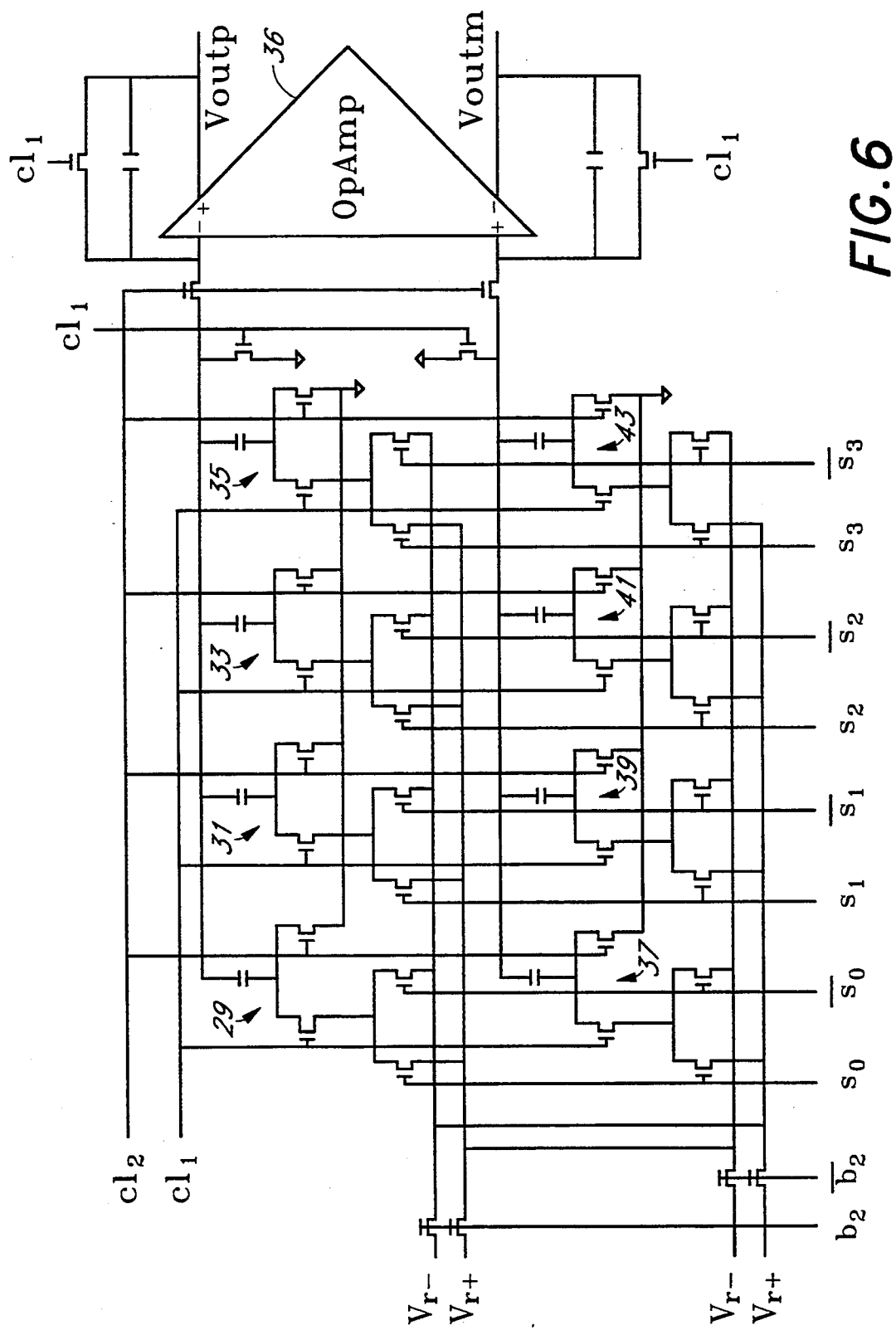
Figure 7B:
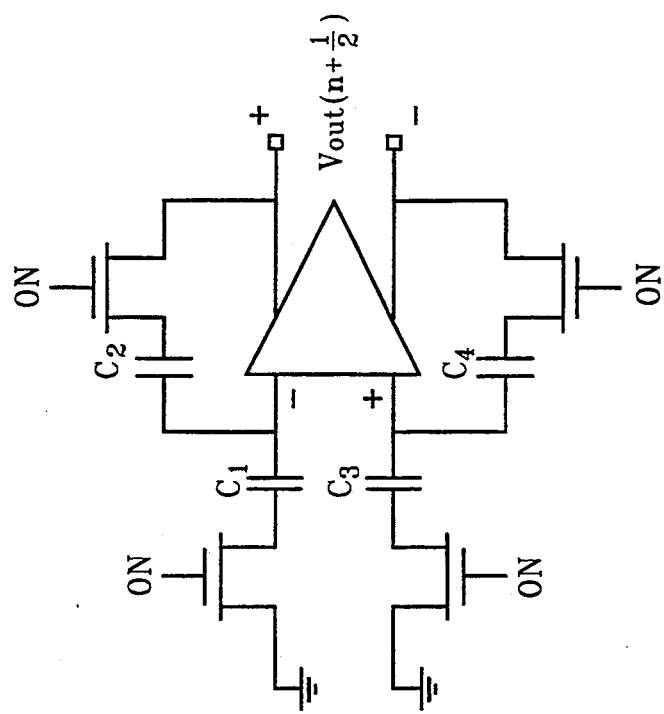
Figure 7A:
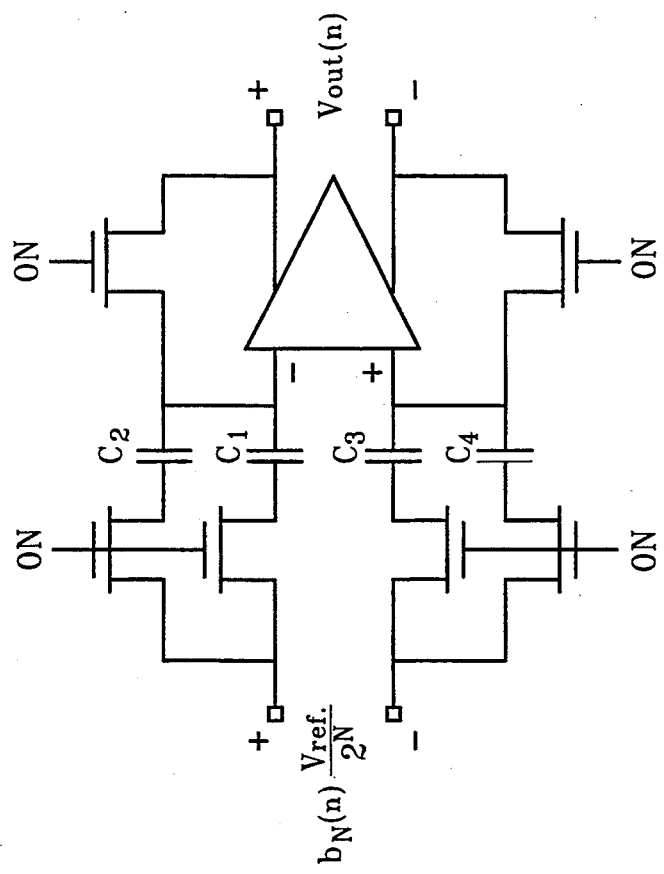
Figure 7D:
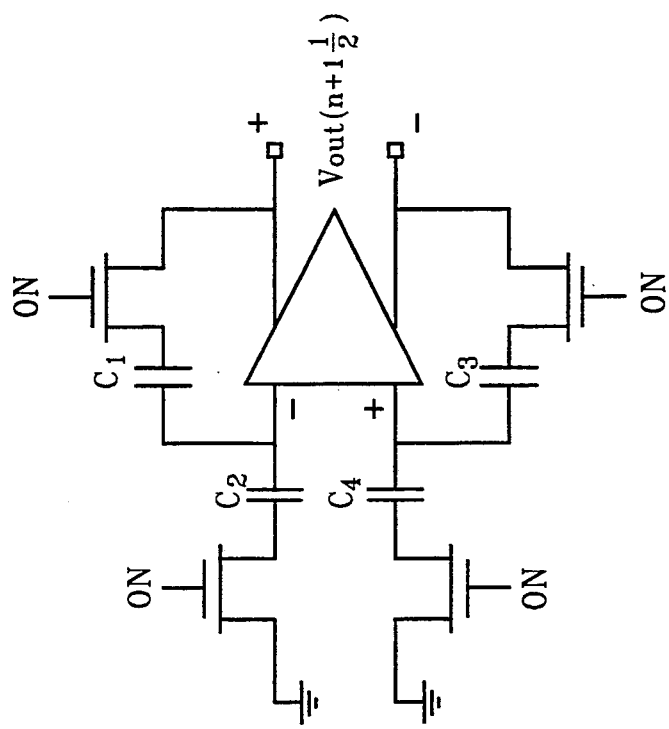
Figure 7C:
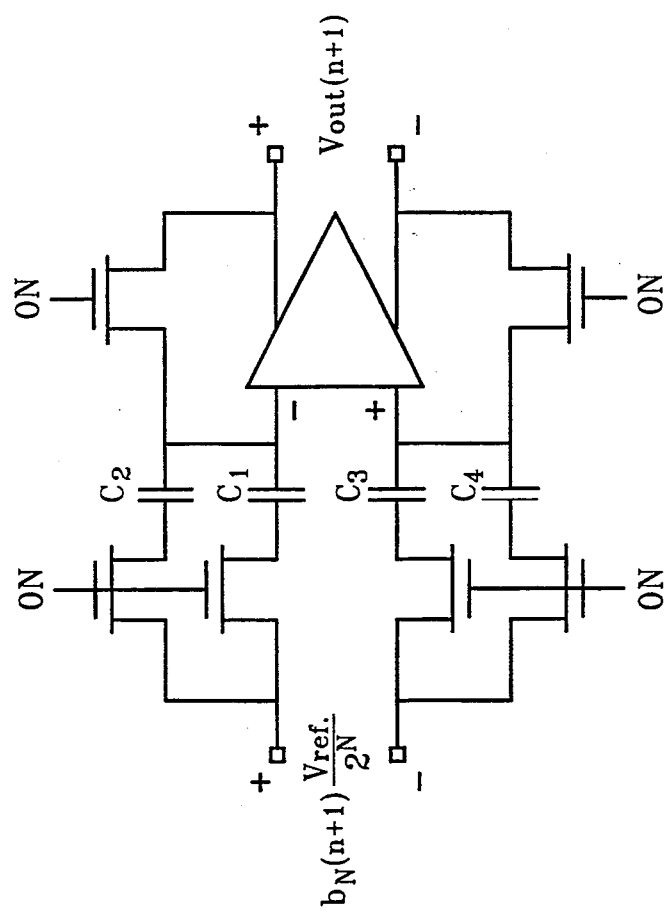

FIG. 5 appears out of routine order following FIG. 3, and shows a block diagram of a second order three-bit D/A converter applying individual level averaging according to the present invention;

FIG. 6 is a schematic diagram of a switched capacitor array for implementing the three-bit D/A converter of FIGS. 3 and 5; and FIG. 7(a) to (d) show a switching scheme and circuit for implementing a multiply-by-two circuit with capacitor averaging according to an alternative embodiment of the invention.

DETAILED DESCRIPTION OF THE PREFERRED EMBODIMENT

One of the main considerations for incorporating a multi-bit over a single-bit quantizer inside the feedback loop of a Sigma-Delta converter is the prevention of overloading and thus the provision of stability. This allows the use of higher order coders which can provide a much higher SNR for the same oversampling ratio. In addition, each extra bit in the quantizer provides a 6dB increase in the SNR.

Figure 1:
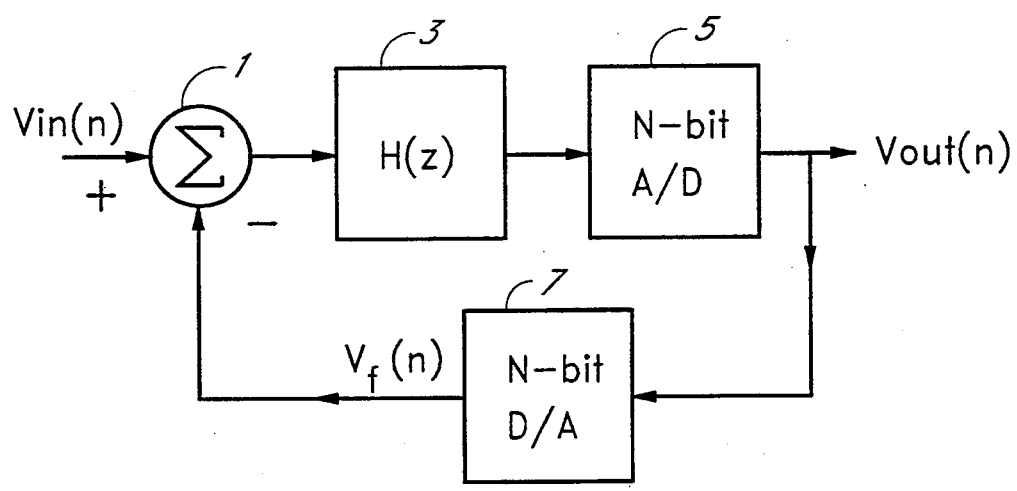
FIG. 1 is a simplified block diagram of a multi-bit Sigma-Delta A/D converter according to the prior art.

FIG. 1 shows a typical, simplified block diagram of a multi-bit Sigma-Delta A/D converter according to the prior art, comprising a summer 1 for receiving an input analog signal $V_{in}(n)$. An output of summer 1 is connected to the input of a loop filter 3 having a transfer function $H(z)$. An output of loop filter 3 is connected to the input of an N-bit A/D converter 5. The output signal $V_{out}(n)$ from A/D converter 5 is fed back via N-bit D/A converter 7 to the negative input of summer 1.

As an example, in the first order Sigma-Delta converter of FIG. 1 the D/A converter 7 may be considered as having two unit elements, for generating three analog output levels $V_f(n)=$ "0", "½" and "1" as shown in FIG. 2a(i).

If there is a mismatch between the two elements such that their values are "1.1" and "1.2", the D/A converter 7 will have three levels corresponding to: "0", "1.1/2.3" and "1" (i.e. transfer characteristic $\phi_1$) as shown in FIG. 2a (ii). If unit element flipping is done at a clock frequency $f_{clk}$, then at every clock cycle, the transfer characteristic $\phi_2$ of D/A converter 7 will be shown in FIG. 2a(iii), whose levels are "0", "1.2/2.3" and "1". If for example a dc input $V_{in}(n)$ of "0.25" is applied to $V_{in}(n)$ of the first order $\Sigma$-$\Delta$ modulator of FIG. 1 with an ideal feedback D/A converter 7, the output $V_{out}(n)$ will consist of a periodic digital sequence "00", "01", "00", "01" . . . etc, resulting in a periodic D/A output sequence $V_f(n)=$ "0", "½", "0", "½" as shown in FIG. 2b(i). This sequence will produce an average of "0.25", which is identical to the input.

For the normal non-ideal feedback D/A converter 7, the feedback signal $V_f(n)$ will no longer be periodic. To analyze the behavior of the circuit consider the first four cycles. If the initial value of the integrator in the first order coder (i.e. loop filter 3) is assumed to be zero, then the $\Sigma$-$\Delta$ coder output is "00", "01", "00", "01" for the first four cycles. Therefore $V_f(n)$ will consist of "0", "1.1/2.3", "0", "1.1/2.3" as shown in FIG. 2b(ii). It is seen that even though the feedback signal $V_f(n)$ is interpolating between the input signal of "0.25", the average value of $V_f(n)$ is less than "0.25" and a conversion error is created. This conversion error is fed back to the input of the $\Sigma$-$\Delta$ coder, and stored in the integrator.

In the situation considered above, a positive conversion error will be stored in the integrator and when the absolute value of the accumulated error is larger than 1 LSB of the forward A/D converter 5 an extra "0.1" will be generated. As a matter of fact, since the average value of the feedback signal $V_f(n)$ is forced to be the same as the input $V_{in}(n)$ value due to the negative feedback action of D/A converter 7, the value "1.1/2.3" will be generated more than 50% of the time to compensate for the error. This results in the output code changing from a periodic sequence of "00", "01", "00", "01" to one consisting of an extra "01" at predetermined intervals.

The conventional clocked averaging approach endeavors to correct this conversion error by averaging the $E_{DAC}$ (Error of the internal D/A converter 7). However, it has been found that the averaging mechanism provided by the feedback loop of the $\Sigma$-$\Delta$ converter can interact with the averaging mechanism provided by the clocked averaging approach. The feedback sequence $V_f(n)$ for the clocked averaging algorithm is shown in FIG. 2b(iii). Again if it is assumed that $V_{out}(n)$, and hence the input to D/A converter 7, is "00", "01", "00", "01" for the first four cycles, then $V_{out}(1)=$"00" and the $\phi_1$ curve of FIG. 2a(ii) is activated. Therefore $V_f(1)=$"0". Next, $V_{out}(2)=$"01" and the curve $\phi_2$ of FIG. 2a(iii) is activated, giving $V_f(2)$ a value of "1.1/2.3". At n=3 the curve 6, $\phi_3$ is activated. However due to the interpolating nature of the $\Sigma$-$\Delta$ modulator, the modulator output $V_{out}(n)$ does not stay constant. Instead, $V_{out}(3)$ is "00", resulting in a $V_f(3)$ of "0". Finally, at n=4 the curve $\phi_2$ is activated again. Again $V_{out}(n)$ has been changed and $V_{out}(4)=$"01", resulting in a D/A output $V_f(4)$ of "1.2/2.3". It will be noted that this is identical to $V_f(2)$ and therefore no cancellation has been achieved. Consequently the average value of $V_f(n)$ differs from 0.25, and like the case discussed above in which there is no unit element flipping, a conversion error is introduced. However, in the present case, the conversion error stored in the integrator is negative. Again, when the absolute value of this conversion error is larger than 1 LSB of the forward A/D converter 5, an extra "00" will be generated.

It can be seen that cancellation at any D/A level depends on the relative timing between the interpolating waveform $V_f(n)$ at the feedback node and the flipping waveform for selecting between the two unit elements characterized by transfer functions $\phi_1$ and $\phi_2$. In the case when the input is a sine wave instead of a dc signal, the interpolating waveform $V_f(n)$ is a pulse density modulated representation of the instantaneous value of the input. Therefore, given an input sine wave at a particular frequency, the interpolating waveform can interact with the flipping operation in such a way that a different amount of cancellation is achieved for different D/A levels. The low frequency portion of the resulting signal, which is obtained by time averaging the output of D/A converter 7, will then be distorted from the original sine wave. Furthermore the resulting distortion, which is dependent on the amount of cancellation, is related to the flipping frequency. This distortion can generate tones that are functions of the input frequency and flipping frequency, as discussed in B. Leung, "Architectures for Multi-bit Oversampled DAC Employing Dynamic Element Matching Techniques," 1991 IEEE International Symposium on Circuits and Systems, pp. 1657–1660 (May, 1991).

To ensure that the averaging action occurs regardless of the nature of the interpolating waveform, the individual level averaging system according to the present invention cycles through all unit elements used to represent an individual digital code. With reference to the first order modulator of FIG. 1, where $V_{out}(n)$ for the first four cycles is again assumed to be "00", "01", "00", "01", the D/A converter 7 output $V_f(n)$ is shown in FIG. 2b(iv). At n=1, $V_{out}(1)=$"00" and the curve $\phi_1$ is selected, and $V_f(1)$ will be "0". The fact that the $\phi_1$ curve has been used for the code "00" is now returned in memory, as discussed in greater detail below with reference to FIG. 3. At n=2, $V_{out}(2)=$"01" and the curve $\phi_1$ is selected, which means that $V_f(2)$ will be "1.1/2.3". Again the fact that the $\phi_1$ curve has been used for the code "01" is stored in memory. At n=3, $V_{out}(3)$="00". Since at n=1 the curve $\phi_1$ has been used, this time the $\phi_2$ curve is selected. With $V_{out}(3)$="00" and a$\phi_2$ curve, $V_f(3)$="0". Finally at n=4, $V_{out}(4)$ is "01". Again, since at n=2 the curve $\phi_1$ has been used, so this time the $\phi_2$ curve is selected and $V_f(4)$="1.2/2.3". Therefore, both the values "1.1/2.3" and "1.2/2.3" have been utilized to represent the digital code "01", giving an average value of "½". Consequently, the average value of $V_f(n)$ is "0.25". This is identical to the input value and no conversion error is generated.

The output sequences $V_f(n)$ for the different cases are now summarized in Table I.

TABLE I

DAC output $V_p(n)$ For Different Averaging Algorithms
$V_{in} = 0.25$, First Order $\Sigma$-$\Delta$ Coder, 2 Unit Elements

| Case | n = 1 | n = 2 | n = 3 | n = 4 | Avg Value | Error |
|---|---|---|---|---|---|---|
| Ideal | 0 | 0.5 | 0 | 0.5 | 0.25 | 0 |
| No Averaging | 0 | $\left(\frac{1.1}{2.3}\right)$ | 0 | $\left(\frac{1.1}{2.3}\right)$ | 0.239 | 0.011 |
| Clocked Averaging | 0 | $\left(\frac{1.2}{2.3}\right)$ | 0 | $\left(\frac{1.2}{2.3}\right)$ | 0.261 | 0.011 |
| Individual Level Averaging | 0 | $\left(\frac{1.1}{2.3}\right)$ | 0 | $\left(\frac{1.2}{2.3}\right)$ | 0.25 | 0 |

Thus, according to the present invention, the averaging activity applied to the D/A converter 7 does not interfere with the averaging activity provided by the negative feedback action of the $\Sigma$-$\Delta$ coder. This in turn ensures that cancellation of the error $E_{DAC}$ can be achieved regardless of the interpolation waveform.

According to the embodiment of FIG. 3, a D/A converter is provided for implementing the individual level averaging approach of the present invention. A digital input signal L is applied to a thermometer-type encoder 9 and to a memory implemented by pointers and update circuits 11, which can be implemented as a set of registers. The enboder 9 sets high the number of output lines M thereof equal to the digital code L. The decoded signal M and an M-bit pointer signal from circuits 11 are applied to MxM switch 13 which in response selects predetermined ones of M unit elements 15. The outputs of unit elements 15 are applied to an output analog summer 17. Thus, according to the D/A converter of FIG. 3, a memory is introduced for each transfer curve of the D/A converter at each level. This will ensure that all transfer curves corresponding to each digital code are exercised in the representation of that particular digital code. If this approach is applied to the first order coder example outlined above, the output of the first four cycles will again be 00, 01, 00, 01. At $T_{clk}$, the input code is 00 and the memory corresponding to the level 00 will provide the pointer that selects the appropriate D/A converter transfer curve. The algorithm begins with the curve $\phi_1$ (FIG. 2a(ii)) which means that the D/A converter output will be 0. The memory 11 corresponding to input code 00 is then updated and points to curve $\phi_2$. At $2T_{clk}$, the input code is 01 and a different memory location corresponding to the level 01 provides the pointer for selecting the appropriate D/A converter transfer curve. Again starting off with curve $\phi_1$ the D/A converter output will be 1.1/2.3, which is different from the clocked averaging case when the curve $\phi_2$ is selected and a value of 1.2/2.3 is generated. The memory corresponding to the level 01 is now updated and points to the curve $\phi_2$. At $3T_{clk}$, the input code is 00. Since at $T_{clk}$ the memory corresponding to 00 was updated, the curve $\phi_2$ is selected this time and a 0 is generated. Finally, at $4T_{clk}$ the input code is 01. Again, since at $2T_{clk}$ the memory 11 was updated, the curve $\phi_2$ is selected. Hence the D/A converter has an output value of 1.2/2.3. Therefore both the values 1.1/2.3 and 1.2/2.3 have been utilized to represent the logic high portion of digital code L.

Thus, for a given code, the memory 11 selects a pointer to the switch matrix 13 which in turn provides the next set of unit elements 15. The pointer is then updated. Finally, the $M=2^n$ elements are activated and summed to form the analogue output.

Figure 4:
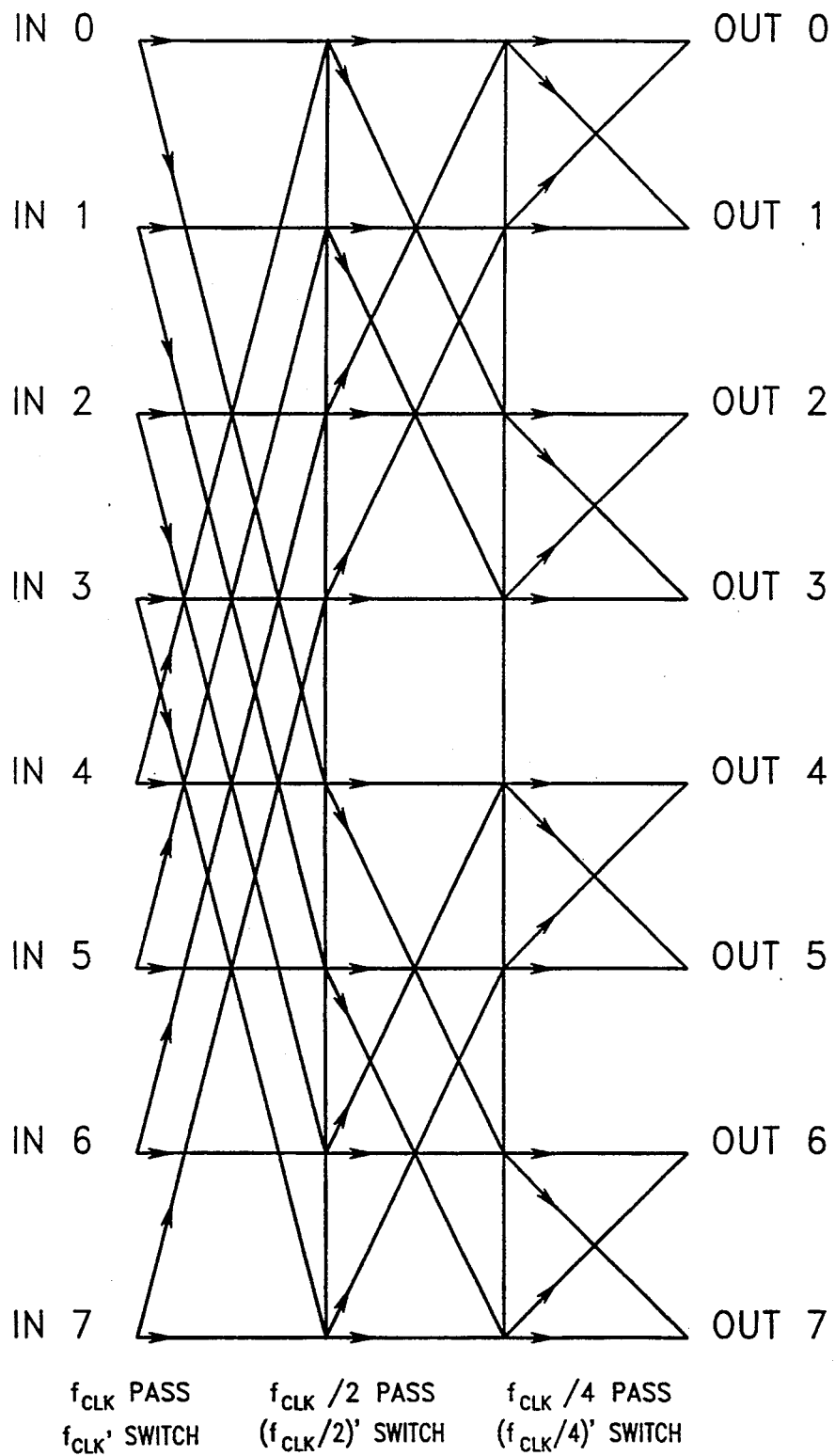
FIG. 4 is a schematic representation of a three-bit clocked flipping scheme for the D/A converter of FIG. 3.

As discussed above, the unit elements 15 are flipped with respect to one another for reducing distortion in the output signal for a sinusoidal input. An example of the proposed flipping scheme for the A/D converter of FIG. 3 having three bits (i.e. eight unit elements 15) is shown in FIG. 4. Here $In_0 \ldots In_7$ represent eight unit elements of the D/A converter that have a slight mismatch among them. $Out_0 \ldots Out_7$ is a linear array of unit elements which generate the final analog value corresponding to a given input digital code. The clocked flipping algorithm works by flipping the transfer characteristics of the D/A converter as follows: First of all, the top n/2 elements are swapped with the bottom n/2 elements at a rate of $f_{clk}$. Secondly, the top n/4 elements are swapped with the next n/4 elements at the rate of $f_{clk}/2$. At the same time the bottom two partitions of n/4 elements are swapped among themselves. Finally, adjacent pairs of elements are swapped at the rate of $f_{clk}/4$.

The flipping algorithm is implemented in the present invention by the D/A converter shown in FIG. 3, and the frequency spectrum of the output indicates that the harmonic distortions have been modulated to frequencies around multiples of $f_{clk}/8$, instead of to white noise. A comparison to the random averaging case indicates that this approach can increase the SNR performance by 15 dB for a 0.1% systematic linear gradient mismatch between the elements in the 3-bit D/A converter.

For the above approach residual noise is still generated in the baseband due to incomplete cancellation. In order to get complete cancellation for a given digital input of D/A converter 7 (FIG. 3), a complete set of analog outputs corresponding to the digital input has to be selected. In the 2-bit case considered above, for the digital code 01, the set has two elements: 1.1/2.3 and 1.2/2.3. The number of elements in this set is referred to as the "cancellation cycle". As shown in Table 1, if the input $V_{in}$ is 0.25 the output of D/A converter 7 is 0, 1.1/2.3, 0, 1.2/2.3 for the first four cycles. If $V_{in}$ changes its value at, for example, cycle four, then D/A converter 7 has not exercised all of the analog outputs corresponding to the digital code 01 and errors will be generated. Consequently, to reduce the error due to imperfect the cancellation the cycle shoud be kept small. However, the cancellation cycle for a D/A converter with N elements is dependent on the digital input. As an example, consider a 2-bit D/A converter which as four elements with values: 1.1, 1.2, 1.3, 1.4. For an input code of 01, four D/A output signals 1.1/5, 1.2/5, 1.3/5, 1.4/5 have to be generated to ensure that the average analog output is exactly ¼, which means that the cancellation cycle is 4. On the other hand, with an input code of 10, there are again four possible D/A output signals. 1.1+1.2/5, 1.2+1.3/5, 1.3+1.4/5, 1.4+1.1/5. In this case, only a sequence of two D/A outputs needs to be selected, namely 1.1+1.2/5 and 1.3+1.4/5 or 1.2+1.3/5 and 1.4+1.1/5, to ensure that the average analog output is ½. Therefore, the cancellation cycle in this case is only two. Since the cancellation cycle is input dependent, the algorithm which performs the D/A output selections for a given digital code should do so with the minimum cancellation cycle. Compared to the case when a fixed cancellation cycle is applied for all the input codes, this input dependent selection scheme results in a smaller "average" cancellation cycle. Simulations have confirmed that this technique can improve the signal to noise ratio of a third order $\Sigma$-$\Delta$ converter by up to 7 dB with an oversampling ratio of 32 and a 3-bit internal, having a systematic linear gradient mismatch of 0.1%.

FIG. 5 shows the topology of a three-bit second-order multi-loop $\Sigma$-$\Delta$ D/A converter. The digital input, (i.e. PCM code) is subtracted in summer 18 by the three-bit fed-back code, and the difference is applied to a digital integrator 19. The output of the first integrator 19 is subtracted from the three-bit fed-back code in a further summer 21, and the summer 21 output is applied to a second integrator 23. The output of the second integrator 23 is truncated with the digital quantizer 25 to obtain the three-bit output code. The three-bit pulse-density modulated code from the quantizer 25 is fed into a three-bit internal D/A converter of the form depicted in FIG. 3. A second order MASH D/A converter with a 3-bit internal D/A converter can also be implemented.

A fully differential switched capacitor array may be used to implement the three-bit internal D/A converter of the present invention. The simplified circuit diagram of the D/A converter according to the preferred embodiment is shown in FIG. 6. The thermometer code 5; is generated from the two LSB's, $b_1$ and $b_0$ of L=$b_2$, $b_1$, $b_0$. The MSB $b_2$ is used to select the reference voltages, $V_{r+}$ and $V_{r-}$ for the differential structure, while the bits $S_0$, $S_1$, $S_2$ and $S_3$ are encoded according to the truth table in Table 2 (i.e. via the pointers and update circuits 11 of FIG. 3).

TABLE 2

| Occurence | $b_1$ | $b_0$ | $s_0$ | $s_1$ | $s_2$ | $s_3$ |
|---|---|---|---|---|---|---|
| Always | 0 | 0 | 0 | 0 | 0 | 0 |
| 1st | 0 | 1 | 1 | 0 | 0 | 0 |
| 2nd | 0 | 1 | 0 | 1 | 0 | 0 |
| 3rd | 0 | 1 | 0 | 0 | 1 | 0 |
| 4th | 0 | 1 | 0 | 0 | 0 | 1 |
| 1st | 1 | 0 | 1 | 1 | 0 | 0 |
| 2nd | 1 | 0 | 0 | 1 | 1 | 0 |
| 3rd | 1 | 0 | 0 | 0 | 1 | 1 |
| 4th | 1 | 0 | 1 | 0 | 0 | 1 |
| 1st | 1 | 1 | 1 | 1 | 1 | 0 |
| 2nd | 1 | 1 | 0 | 1 | 1 | 1 |
| 3rd | 1 | 1 | 1 | 0 | 1 | 1 |
| 4th | 1 | 1 | 1 | 1 | 0 | 1 |

The details of operation of the circuit shown in FIG. 6 would be well known to a person skilled in the art. Basically, the eight unit elements are implemented differentially with four unit elements 29–35 connected to the inverting input of a differential amplifier 36 and unit elements 37–43 connected to the noninverting input of differential amplifier 36. The unit elements and the + and − outputs of differential amplifier 36 are clocked via non-overlapping clocks $cl_2$ and $cl_1$. Thus, in the case of a three-bit digital code L=001, then $b_1$=0 and $b_0$=1. According to the truth table illustrated in Table 2, one of the decoded gate control signals $s_0$, $s_1$, $s_2$ and $s_3$ will be at a logic high level. Since $b_2$=0, then the lower voltage rail is enabled for applying $Vr-$ and $Vr+$ to the left and right capacitor charging gates, respectively, for the top row of unit elements 29–35, and $Vr+$ and $Vr-$ are applied to the left and right charging gates, respectively, of the lower row of unit elements 37–43. Depending on the occurrence of the code $b_1b_0$=01, $b_0$, a predetermined pair 29,37 or 31,39 or 35,43 will be selected for applying differential charge to the amplifier 36. For example, if each unit element is considered to have a value of 1, then for the first occurrence of $b_1b_0$=01 unit elements 29 and 37 will be charged to 1 and −1, respectively, while unit elements 31-35 are charged to −1 and unit elements 39–43 are charged to 1.

If the next digital input code is L=010, then a predetermined two pairs of the upper and lower unit elements will be charged to −1 and the remaining two pairs of elements will be charged to 1, depending on the occurrence of $b_1$, $b_0$=1.0.

If on the next clock cycle, the digital input code returns to L=001, then, since this is the second occurrence of $b_1b_0$=01, then $s_1$=1, while $s_0$, $s_2$ and $s_3$ are all 0 resulting in unit elements 31 and 39 charging to 1 and −1, respectively, while unit elements 29, 33 and 35 each charge to −1 and unit elements 37, 41 and 43 each charge to 1. In this way, by permuting the D/A converter unit elements on a per level basis, all elements used to represent an individual digital code are exercised sequentially so that error due to element mismatch has a high frequency spectrum, instead of a white spectrum as, as exhibited by conventional random averaging.

The three-bit $\Sigma$-$\Delta$ DAC has been implemented with a 1.2 μm CMOB double-poly/double-metal technology, using both single-ended and differential designs. Test results were obtained with the single-ended version. The chip was tested at a clock rate of 200 KHz with an 800 Hz input signal. When different dynamio element matching techniques were applied, considerable harmonic distortion suppression was obtained. For the individual level averaging technique, a 24 dB improvement of harmonic distortion suppression was achieved. The SNRs (signal-to-noise ratios) of both multi-loop and MASH structures for conventional random averaging and individual level averaging techniques with an equivalent capacitor mismatch of 1% are shown in Table 3.

TABLE 3

| Comparison of SNR for Different Architectures | | |
|---|---|---|
| | Random Averaging | Indiv. Level Averaging |
| Multi-Loop | 53dB | 59dB |
| MASH | 51dB | 61dB |

An internal D/A for implementing pipelined capacitor averaging can be realized using switched capacitor implementation so that the overall linearity is limited by non-ideal effects of the subblocks from each stage, as discussed in F. Wang, G. Temes, S. Law, "A Quasi-Passive CMOS Pipeline D/A Converter," IEEE Journal of Solid-State Circuits, pp. 1752-1755 (December, 1989). These non idealities stem from errors due to non-ideal opamps, switches and capacitors. Unlike a pipelined A/D converter, a pipelined D/A converter, does not need a sample and hold circuit and there is no S/H error. Because there is no A/D converter in a pipelined D/A converter extra circuitry for digital error correction is not needed, as discussed in Y. Lin, B. Kim, P. Gray, "A 13-b 2.5 MHz Self-Calibrated Pipelined A/D Converter in 3-um CMOS," IEEE Journal of Solid-State Circuits, pp. 628-636 (April 1991). The overall linearity is limited by the following errors of the individual stages:

1) D/A subconverter error related to capacitor mismatch.

2) Summing error related to finite opamp gain, charge feedthrough, injection, opamp offset.

3) Multiplying error related to finite opamp gain, capacitor mismatch.

The D/A subconverter error due to capacitor mismatch can be eliminated if only 1 bit is resolved per stage. For an N-bit D/A converter this means the number of stages equals N and the multiply circuits become multiply-by-two circuits. For an oversampled D/A converter even though the overall resolution is high, the resolution N for the internal D/A converter is small, typically on the order of three to four. Consequently the increase in hardware is not prohibitive for this application. Furthermore, if a 1-bit D/A converter is used with fully differential architecture, the offset error is eliminated.

All charge circuits based on opamps transfer charges between capacitors rather imperfectly because of finite amplifier gain. Finite opamp gain errors can be compensated for using circuit techniques like calibration, but the simplest way is to maintain a high DC gain, as discussed in K. Bult, G. Geelen, "A Fast-Settling CMOS Op AMP with 90 dB DC Gain and 116 MHz Unity-Gain Frequency," Digest if Technical Papers, International Solid-State Circuits Conference 1990, pp. 108-109 (February 1990). The opamp offset error is automatically cancelled because the signal is sampled on the input capacitors by connecting the opamp in a unity-gain configuration. The differential charge injection can be eliminated by employing a correlated double sampling technique, as discussed in B. Song, M. Tompsett, et al., "A 12-bit 1-Msample/s Capacitor Error-Averaging Pipelined A/D Converter," IEEE Journal of Solid-State Circuits, pp. 1324-1333 (December, 1988).

Considering the third error source which results from capacitor mismatch, in the past a technique has been applied to Nyquist rate pipelined converters that involves using an extra clock phase to average the error due to capacitor mismatch. For a D/A converter this scheme will result in extra delay and reduce the conversion speed. The present invention attempts to eliminate this delay by exploiting the fact that the digital input of the internal D/A converter for an oversampled D/A converter stays relatively constant during adjacent clock cycles. Consequently, instead of using an extra clock phase the present approach distributes the averaging action over two adjacent clock cycles as shown in FIGS. 7(a) to (d). The capacitors in FIG. 7 are assumed to have mismatches as follows:

$$\frac{C_1}{C_2} = \frac{1 + \alpha_1}{1 - \alpha_1}$$

$$\frac{C_3}{C_4} = \frac{1 + \alpha_2}{1 - \alpha_2}$$

where $\alpha_1, \alpha_2 << 1$.

The circuit of FIG. 7 forms a multiply-by-2 circuit with capacitor averaging such that in the firstclock phase (FIG. 7 (a)) $\phi_1(n)$, $b_N(n)V_{ref}/2^N$ is sampled, and $V_{out}(n)$ is reset to 0. For $\phi_2(n+1)$, (FIG. 7(b)) from charge conversation $V_{out}(n+\frac{1}{2})\times(2+\alpha_1+\alpha_2)b_N(n)V_{ref}/2^N$. In the second clock phase (FIG. 7(c)) $\phi_1(n+1)$, $b_N(n+1)$ $V_{ref}/2^N$ is sampled and $V_{out}(n+1)$ reset to 0. For $\phi_2$ (n+1), (FIG. 7(d)), from charge conversion $V_{out}(n+3/2)=(2-\alpha_1-\alpha_2)b_N(n+1)V_{ref}/2^N$.

From the frequency domain point of view the proposed scheme modulates the harmonic distortion components to $f_s/2 - f_{harmonic}$. It should be noted that if this technique is applied to a Nyquist rate pipelined D/A converter, the modulated harmonic distortion components will fall into the passband and generate undesirable tones. For the oversampled D/A converter, in addition to the modulation of harmonic distortion components the averaging action increases the baseband noise because the high frequency quantization noise is being modulated into the passband. For a multiply-by-two circuit only 2 unit capacitors are involved. Consequently only two elements need to be averaged and the harmonic distortion components will always be modulated to frequencies around f/2, as opposed to frequencies around $f_s/M$, as in the conventional clocked averaging approach. From simulations the proposed invention enjoys a 10 db improvement over the random averaging approach in dynamic range for a third order oversampled D/A converter with a 3-bit pipelined internal D/A converter having a 0.1% random mismatch.

Other embodiments and variations of the invention are possible within the sphere and scope of the description herein.

I claim:

1. A Sigma-Delta converter, comprising:
   a) means for receiving an input digital signal;
   b) at least one digital loop filter and quantizer having an input and an output;
   c) at least one subtractor having a first input connected to said means for receiving, a second input connected to said output of said at least one digital loop filter and quantizer, and an output connected to said input of said at least one digital loop filter and quantizer for subtracting from said input digital signal an output digital signal from said at least one digital loop filter and quantizer, and in response generating a difference signal for application to said input of said at least one digital loop filter and quantizer; and d) a digital-to-analog converter having a plurality of unit elements with minor mismatching therebetween, for receiving and converting to analog said output digital signal from said at least one digital loop filter and quantizer, and in response generating an output analog signal, wherein said digital-to-analog converter comprises means for cyclically selecting successive different permutations of said unit elements for converting each value of said output digital signal thereby canceling said mismatching between unit elements.

2. The Sigma-Delta converter of claim 1, wherein said means for cyclically selecting further comprises:

e) means for receiving and encoding each said value of said output digital signal and in response generating an encoded digital signal;

f) means for receiving said output digital signal and in response generating and updating a pointer signal for each value of said output digital signal;

g) a crosspoint switch for receiving said pointer signal and in response transmitting said encoded digital signal to a predetermined one or more of said unit elements according to said successive different permutations; and h) an analog summer for summing respective signals output from said unit elements and in response generating said analog output signal.

3. The Sigma-Delta converter of claim 2, wherein said plurality of unit elements further comprise a switched capacitor array and said analog summer further comprises a differential amplifier having inverting and non-inverting inputs connected to respective portions of said array.

4. The Sigma-Delta converter of claim 1, wherein said digital-to-analog converter comprises one or more series connected multiply-by-two circuits each incorporating capacitor averaging means.

* * * * *